(12) United States Patent
Kitabatake et al.

(10) Patent No.: US 7,777,513 B2
(45) Date of Patent: Aug. 17, 2010

(54) POWER SUPPLY VOLTAGE DETECTION CIRCUIT AND SEMICONDUCTOR INTEGRATED CIRCUIT DEVICE

(75) Inventors: Manabu Kitabatake, Kanagawa (JP); Yuji Tada, Kanagawa (JP); Kouji Naganawa, Kanagawa (JP); Tsuyoshi Hirakawa, Kanagawa (JP); Ichiro Mizuguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 158 days.

(21) Appl. No.: 12/213,512

(22) Filed: Jun. 20, 2008

(65) Prior Publication Data

US 2009/0015286 A1   Jan. 15, 2009

(30) Foreign Application Priority Data

Jul. 9, 2007   (JP) .............................. 2007-179363

(51) Int. Cl.
*G01R 31/26* (2006.01)
(52) U.S. Cl. ...................................... 324/763; 324/765
(58) Field of Classification Search ........................ None
See application file for complete search history.

(56) References Cited

U.S. PATENT DOCUMENTS

| 5,517,515 | A | * | 5/1996 | Spall et al. .................. 714/733 |
| 6,711,042 | B2 | | 3/2004 | Ishikawa |
| 6,807,116 | B2 | | 10/2004 | Yamazaki et al. |
| 7,321,525 | B2 | * | 1/2008 | Matsui .................. 365/233.12 |
| 7,668,027 | B2 | * | 2/2010 | Imagawa et al. ............ 365/201 |
| 2003/0028835 | A1 | | 2/2003 | Ishikawa |

FOREIGN PATENT DOCUMENTS

| JP | 2003-043117 A | 2/2003 |
| JP | 2003-077296 A | 3/2003 |
| JP | 2004-055030 A | 2/2004 |

* cited by examiner

*Primary Examiner*—Vinh P Nguyen
(74) *Attorney, Agent, or Firm*—Foley & Lardner LLP

(57) ABSTRACT

A semiconductor integrated circuit device includes a first chip, a second chip to transmit and receive data to and from the first chip, and a through circuit provided in the first chip to transfer a clock signal and a test signal to the second chip. The clock signal and the test signal is inputted from an external device. The through circuit adjusts timing relation between the clock signal and the test signal based on a timing adjust signal. The timing adjust signal is inputted from the external device.

14 Claims, 8 Drawing Sheets

POWER SUPPLY VOLTAGE DETECTION CIRCUIT AND SEMICONDUCTOR INTEGRATED CIRCUIT DEVICE

BACKGROUND OF THE INVENTION

1. Field of the Invention

The present invention relates to a semiconductor integrated circuit device having plural chips of different functions mounted in a single package, and a method of testing the same.

2. Description of Related Art

It has been proposed that a large scale system can be realized in a single package by adopting SiP (System in Package) structure in which plural chips having different functions, such as a memory chip and a logic chip are mounted on a single package. A semiconductor integrated circuit device using the SiP structure can only have limited number of input-output terminals arranged in the package. Therefore, in a common practice, it has no dedicated input-output terminals that allow direct external access to the memory chip, and the memory chip is accessed only through the input-output terminals for the logic chip so that the number of terminals is reduced.

FIG. 7 shows a block diagram of a semiconductor integrated circuit device 101 having MCP (Multi Chip Package) or MCM (Multi Chip Module) structure in accordance with related art 1 (Japanese Unexamined Patent Application Publication No. 2003-77296). In the semiconductor integrated circuit device 101 of the related art 1, a logic chip 2 and a memory chip 3 are mounted in a single package 1.

The logic chip 2 contains a logic circuit 2A, a memory chip test circuit 4, and a selector/input-output circuit 2C. The memory chip test circuit 4 is provided to carry out an operation test for the memory chip 3. The selector/input-output circuit 2C is provided to carry out switching between access signals from the logic circuit 2A and access signals from the memory chip test circuit 4 for the test.

The device is configured such that the memory chip 3 is accessed through the logic chip 2. That is, the memory chip 3 is not directly connected to any external terminals of the package 1, and configured such that data is inputted to or outputted from the memory chip 3 in response to an access request from the logic chip 2. A clock terminal 22, control signal terminals 23, address terminals 24, and data terminals 25 of the logic chip 2 are connected to corresponding terminals 32, 33, 34, and 35 respectively of the memory chip. Plural input-output terminals 20 of the logic chip are connected to external terminals 10 of the package 1.

The access operation from the logic chip 2 to the memory chip 3 is carried out in the following manner. That is, during the normal operation, the memory access signals are supplied from the logic circuit 2A to the memory chip 3 through the selector/input-output circuit 2C. On the other hand, during the memory chip test, the access signals for the memory chip test are supplied from the memory chip test circuit 4 provided in the logic chip 2 to the memory chip 3 through the selector/input-output circuit 2C. With the above-described structure, a high speed operation test can be carried out even after the burn-in that is carried out after the chips are mounted in the package.

FIG. 8 shows a block diagram of semiconductor integrated circuit device 102 having a test interface circuit 2 in accordance with related art 2 (Japanese Unexamined Patent Application Publication No. 2004-55030) Similarly to the above-mentioned related art 1, a logic chip and a memory chip (internal memory) 3 are mounted in a single package in the semiconductor integrated circuit device 102. The logic chip contains the test interface circuit 2. A memory transfer circuit 4, which transfers data to an internal memory 3 that is mounted in the same package, is provided in the test interface circuit 2. A plurality of input-output terminals are provided in the semiconductor integrated circuit device 102. For example, terminals for a signal that determines signal transfer timing to the internal memory 3 (TCLK), a signal that determines signal/data fetch timing of the internal memory (CLK), a latch timing signal to sample a signal read out from the internal memory (MLAT), and a test clock signal for compensation (TCLKcal) are provided.

In the semiconductor integrated circuit device 102 in accordance with the related art 2, the above-mentioned various signals, i.e., TCLK, CLK, and MLAT are sampled in accordance with the above-mentioned TCLKcal by the common flip-flop circuit 6 provided in the test interface circuit 2 in order to accurately measure timing conditions such as a set-up time and a hold time. Furthermore, it discloses a structure in which phase differences of these latch timing signal, test clock signal, and memory clock signal are externally measured.

Japanese Unexamined Patent Application Publication No. 2003-43117 has proposed a structure in which a set-up time and a hold time are controlled by a delay circuit arranged in the device so that they satisfy their specified values.

In the semiconductor integrated circuit device 101 in accordance with the related art 1, since the test circuit 4 for the memory chip test is arranged in the logic chip 2, a pattern that is used to carry out the operation test of the memory chip cannot be simple. However, if a complicated pattern is incorporated, the test circuit becomes larger in scale.

In the semiconductor integrated circuit device 102 in accordance with the related art 2, since a plurality of external terminals are used to adjust the operation timing of the internal circuit, the total number of pins is increased. If the number of pins becomes larger, it leads to a larger package size. In the semiconductor integrated circuit device in accordance with the above-mentioned Japanese Unexamined Patent Application Publication No. 2003-43117, it raises problems like one that since the circuit includes the delay circuit, the circuit structure becomes more complicated and the circuit becomes larger in scale. Furthermore, since it involves variations in the delay circuit itself, accurate testing is difficult to carry out.

SUMMARY

In accordance with one embodiment of the present invention, a semiconductor integrated circuit device includes: a first chip; a second chip to transmit and receive data to and from the first chip; and a through circuit provided in the first chip to transfer a clock signal and a test signal to the second chip, the clock signal and the test signal being inputted from an external device; wherein the through circuit adjusts timing relation between the clock signal and the test signal based on a timing adjust signal, the timing adjust signal being inputted from the external device. In accordance with another embodiment of the present invention, a method of testing a semiconductor integrated circuit device having a first chip and a second chip in a single package, the second chip being accessible only through the first chip, includes: inputting a clock signal and a test signal from an external device to the first chip, the clock signal and the test signal being to be inputted to the second chip; determining whether or not the test signal satisfies specified values for a set-up time and a hold time with respect to the clock signal in the first chip; if the test signal does not satisfy the specified value, searching for a pass range for the test signal to satisfy the specified values for the set-up time and the hold time with respect to the clock signal by using a timing adjust signal, the phase of the timing adjust signal being controlled by the external device; correcting the output timing of the test signal in accordance with the pass range in the first chip; and sending out the test signal to the second chip.

In one embodiment of the present invention, since the input-output timing of the test signal, which is used to the operation verification of the second chip, is adjusted by using the timing adjust signal sent out from the external device, the set-up time and hold time between the clock signal and test signal can be invariably maintained in a good condition regardless of variations of the delay time occurred in the path from the first chip to the second path. As a result, the intrinsic high-speed memory chip operation independent of the delay amount, which is caused by inductance, parasitic capacitance, resistance, and the like in the path between the first chip and the second chip and similar paths, which in turn caused by production variance, can be achieved.

In accordance with one example, the present invention has an advantageous effect that it can provide a semiconductor integrated circuit device capable of improving the accuracy of the operation test of the second chip.

BRIEF DESCRIPTION OF THE DRAWINGS

The above and other objects and advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Examples of embodiments of the present invention are explained hereinafter. It should be appreciated that other embodiments that are consistent with the spirit of the present invention also fall into the scope of the present invention. In the following explanation, the same signs are used for the same components as those of the above-described prior arts.

Figure 1:
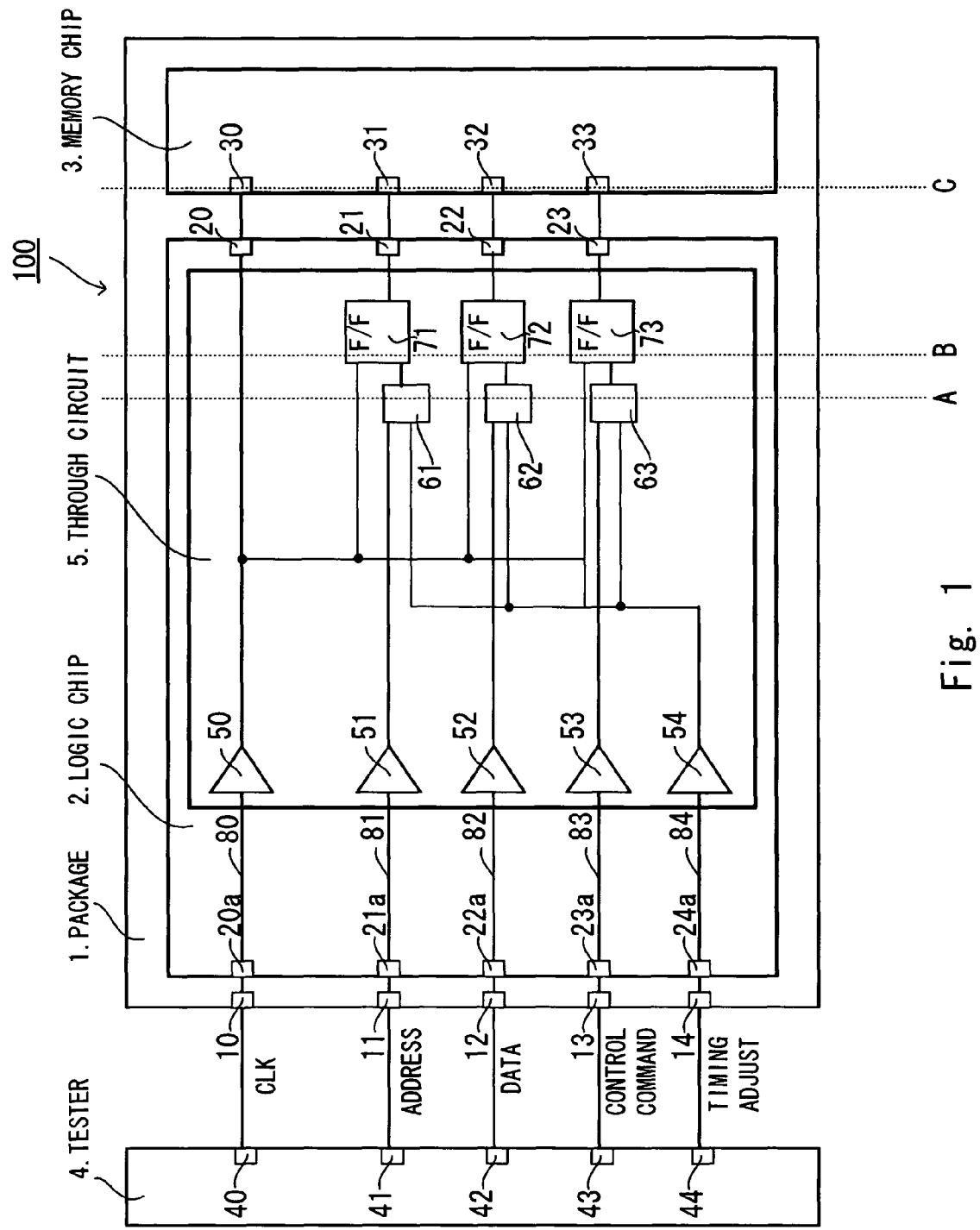
FIG. 1 is a block diagram of a semiconductor integrated circuit device in accordance with one embodiment of the present invention.

FIG. 1 shows a block diagram of a semiconductor integrated circuit device having SiP structure in accordance with one example of the present invention. As shown in FIG. 1, a semiconductor integrated circuit device 100 includes a logic chip 2, which is a first chip having specific functions such as signal processing, and a memory chip 3, which is a second chip such as an SDRAM (Synchronous Dynamic Random Access Memory), both of which are mounted in a single package 1. Furthermore, the package 1 is adapted to connect to a tester (testing device) 4, which is an external device provided on the outside of the package 1.

The package is configured such that the access to the memory chip 3 is carried out through the logic chip 2. That is, the memory chip 3 is not directly connected to any external terminals of the package 1, and configured such that data is inputted to or outputted from the memory chip 3 in response to an access request from the logic chip 2.

The memory chip 3 contains a plurality of memory arrays (not shown). Furthermore, various input-output terminals are arranged around the memory arrays. An intra-memory (clock) terminal 30, intra-memory (address) terminals 31, intra-memory (data) terminals 32, and intra-memory (control command) terminals 33, which are all arranged in the memory chip 3, are connected to a corresponding memory connecting (clock) terminal 20, memory connecting (address) terminals 21, memory connecting (data) terminals 22, memory connecting (control command) terminals 23 respectively of the logic chip 2.

As shown in FIG. 1, a through circuit 5, logic circuit (not shown), and a plurality of input-output terminals are provided in the logic chip 2. The through circuit 5 is a test circuit to carry out the operation verification of the memory chip 3. Four inverters 51-54, three timing correction circuits 61-63, three flip-flop circuits 71-73, and a clock signal line 80, address signal lines 81, data signal lines 82, and control command signal lines 83 are arranged in the through circuit 5. The through circuit 5 is configured such that it is also available for the output operation in the memory operation test.

The clock signal line 80 is connected to the memory connecting (clock) terminal 20 and a tester connecting (clock) terminal 20a in the logic chip 2. Similarly, the address signal lines 81 are connected to the memory connecting (address) terminals 21 and tester connecting (address) terminals 21a. Similarly, the data signal lines 82 are connected to the memory connecting (data) terminals 22 and tester connecting (data) terminals 22a. Similarly, the control command signal lines 83 are connected to the memory connecting (control command) terminals 23 and tester connecting (control command) terminals 23a.

As described above, the above-mentioned memory connecting terminals 20-23 are connected to their respective intra-memory terminals 30-33, which are arranged in the memory chip. Furthermore, the tester connecting terminals 20a-23a are connected to their respective external terminals 10-13 of the package 1. Furthermore, these external terminals 10-13 are connected to intra-tester terminals 40-43 of the tester 4.

Specifically, the tester connecting (clock) terminal 20a that is provided in the logic chip 2 is connected to the external (clock) terminal 10 in the package 1 and the intra-tester (clock) terminal 40 in the tester 4 through the clock signal line 80. Similarly, the tester connecting (address) terminals 21a are connected to the external (address) terminals 11 and the intra-tester (address) terminal 41 through the address signal lines 81. Similarly, the tester connecting (data) terminals 22a are connected to the external (data) terminals 12 and the intra-tester (data) terminal 42 through the data signal lines 82. Similarly, the tester connecting (control command) terminals 23a are connected to the external (control command) terminals 13 and the intra-tester (control command) terminal 43 through the control command signal lines 83. With this structure, the tester 4 is connected to the memory chip 3 through the through circuit 5 in the logic chip 2 (see FIG. 1).

In this embodiment, a timing adjust pin 14, which is used to adjust input-output timing of a test signal for the operation verification of the memory chip (which is also called simply "test signal" hereinafter), is provided in the package 1. The timing adjust pin 14 is an external (timing adjust) terminal, and connected to an intra-tester (timing adjust) terminal 44 in the tester 4, and a tester connecting (timing adjust) terminal 24a in the logic chip 2 through a timing adjust signal line 84. Then, a timing adjust signal is sent out from the tester 4 to the logic chip 2 through the timing adjust signal line 84.

The timing adjust signal is inputted through the inverter 54 in the through circuit 5, and then inputted to the timing correction circuits 61-63. Then, the timing correction circuits 61-63 adjust the input timings to the memory chip 3, of the test signals such as the address (Address) signal, data signal, and control command (Write command, Read command, Row command, Column command, and the like) signals by using this timing adjust signal. The detail of it will be explained later.

The access operation from the logic chip 2 to the memory chip 3 is carried out in the following manner. That is, in the normal operation mode, a memory access signal originated from a logic circuit (not shown) in the logic chip is supplied from the logic chip to the memory chip to carry out the access operation to the memory chip. Various data and clock signals are inputted to the memory chip 3, and the data is taken in the memory chip 3 in synchronization with the clock signal so that the data writing operation is carried out. Furthermore, when a data read instruction is transferred from the logic chip 2, data is read out from the specified address and latched with an inputted clock signal, and then the read data is sent out to the logic chip 2.

In the operation verification test for the memory chip 3, a test signal is supplied from the through circuit 5 that is arranged in the logic chip 2 to the memory chip 3, so that the operation verification test for the memory chip 3 is carried out from the logic chip 2. The waveforms corresponding to the address signal, data signal, control command signal, clock signal (CLK), and timing adjust signal (TIM) are sent from the tester 4 to the through circuit 5 in the logic chip through corresponding external terminals.

In the through circuit 5, the address signal is inputted to the inverter 51 in the through circuit 5 through the address signal lines 81, the data signal is inputted to the inverter 52 through the data signal lines 82, and the control command signal is inputted to the inverter 53 through the control command signal lines 83. Then, the data that are inputted to their respective inverters 51-53 are inputted to the timing correction circuits 61-63. After that, data is supplied to their respective flip-flop circuits 71-73. The test signal that is supplied from the timing correction circuits 61-63 is latched at timing corresponding to the rising edge of the clock signal in the flip-flop circuits 71-73.

After the waveform is shaped in the above-described manner, the data is supplied to intra-memory (I/F) terminals 31-33 in the memory chip 3. At this point, delay may be caused by production variance, and be dependent on inductance, parasitic capacitance, and resistance in the through circuit, the path between the logic chip and memory chip, and the like. This delay amount, when it becomes too large, may preclude the set-up time and hold time from satisfying their specified values.

Figure 2A:
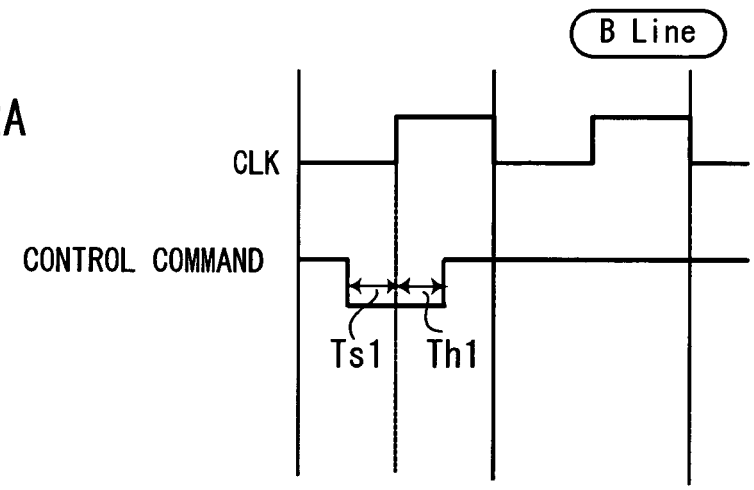
FIGS. 2A, 2B and 2C are timing charts of a semiconductor integrated circuit device in accordance with one embodiment of the present invention.
Figure 2B:
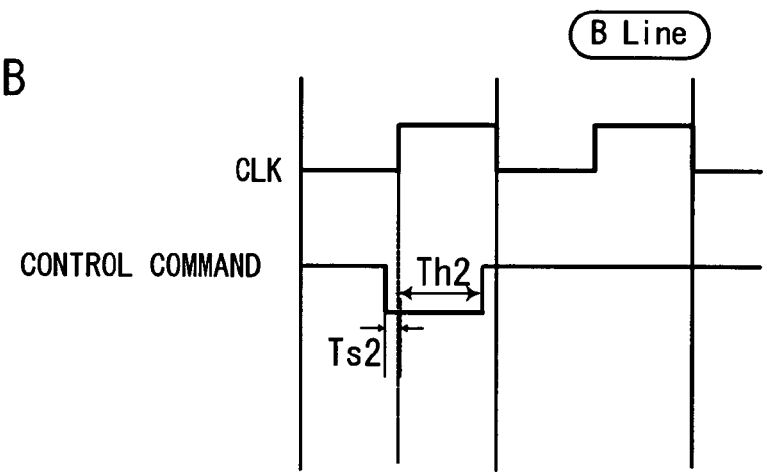
Figure 2C:
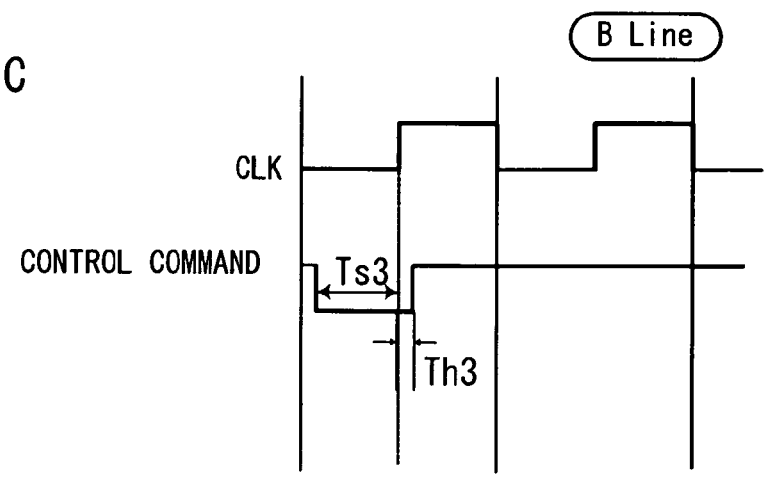

FIGS. 2A-2C, 3A, 3B, 4A, and 4B show timing charts of the semiconductor integrated circuit device 100 in accordance with the present invention. FIGS. 2A-2C are timing charts for a control command signal and a clock signal at the flip-flop circuit 73 of the logic chip 2 (at the dotted line B in FIG. 1). To ensure that data signal and the like are correctly inputted to the memory chip 3, it needs to satisfy a specified minimum time (set-up time) during which the output side has to retain the control signal in advance of the clock signal. Furthermore, to ensure that data are correctly taken in the flip-flop circuits, it also needs to satisfy a specified minimum time (hold time) during which the control signal has to be retained unchanged.

If the test signal such as a control command signal or the like does not satisfy the specified value for a set-up time or the specified value for a hold time with respect to the rising edge or falling edge of the clock signal, it may cause a malfunction in the operation of the memory. Especially, the memory may not be able to carry out the operation in a high operating frequency. Therefore, it is important to satisfy the specified values of a set-up time and a hold time.

FIG. 2A is an example in which the output hold time Ts1 of a control command signal (which is simply called "output hold time" hereinafter) before the rising edge of a clock signal satisfies the specified value for a set-up time, and the taken-in retain time Th1 of the control command signal (which is simply called "taken-in retain time" hereinafter), during which the data is retained after the rising edge of the clock signal, satisfies the specified value for a hold time Meanwhile, FIG. 2B is an example in which an output hold time Ts2 does not satisfy the specified value for the set-up time, while a taken-in retain time Th2 satisfies the specified value for the hold time. Furthermore, FIG. 2B is an example in which a taken-in retain time Th3 does not satisfy the specified value for the hold time, while an output hold time Ts3 satisfies the specified value for the set-up time. When the specified value for a set-up time or a hold time is not satisfied due to the production variance or the like, it is adjusted by the timing adjust signal.

Figure 3A:
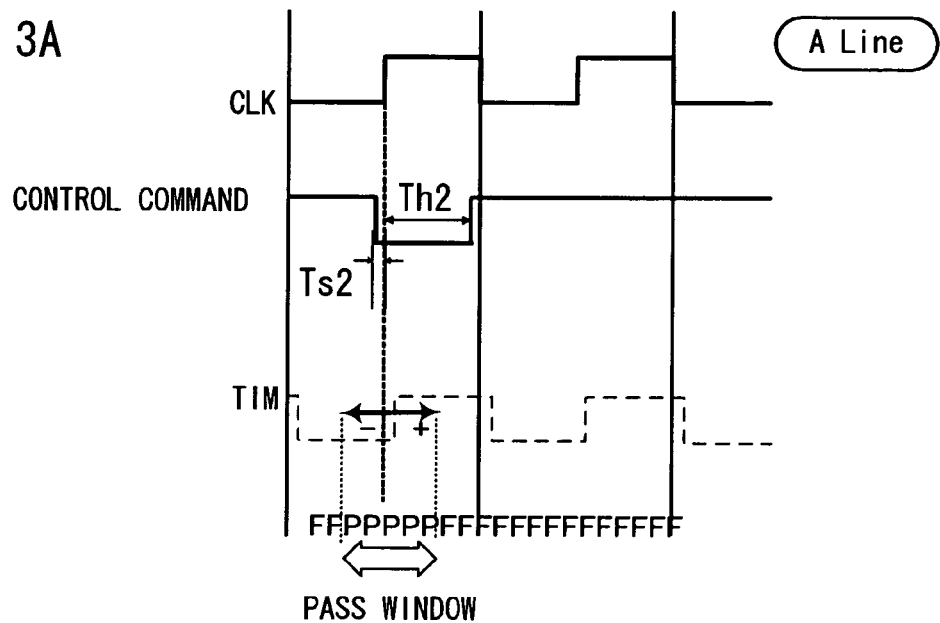
FIGS. 3A and 3B are timing charts at the dotted line A in FIG. 1.
Figure 3B:
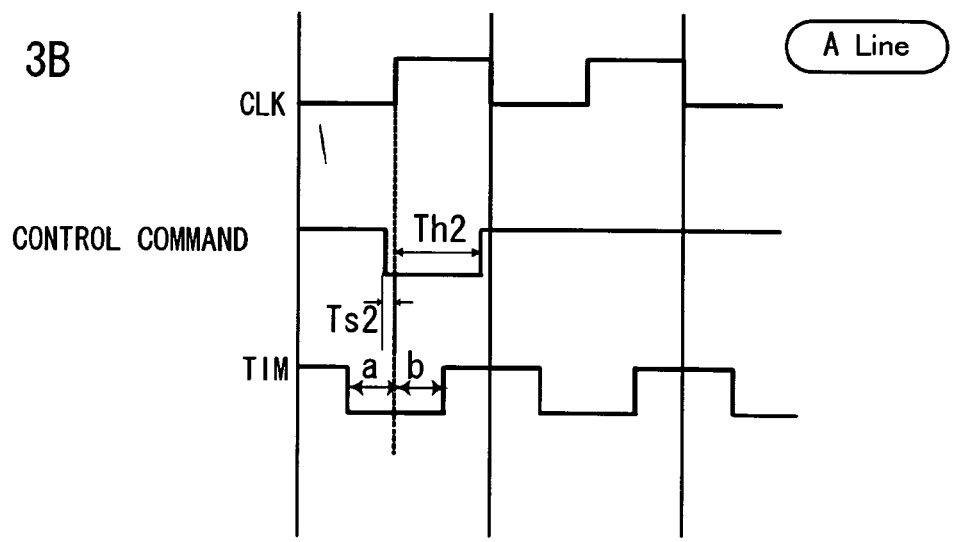

FIGS. 3A and 3B show timing charts for a control command signal, a clock signal, and a timing adjust signal at the point shown by the dotted line A in FIG. 1. Similarly to FIG. 2B, in the example of FIG. 3A, an output hold time Ts2 does not satisfy the specified value for a set-up time, while a taken-in retain time Th2 satisfies the specified value for a hold time. In such case, the tester 4 search for points where normal operation is achieved between the timing adjust signal and control command signal (i.e., timings satisfying the specified values for the set-up time and hold time).

Figure 6:
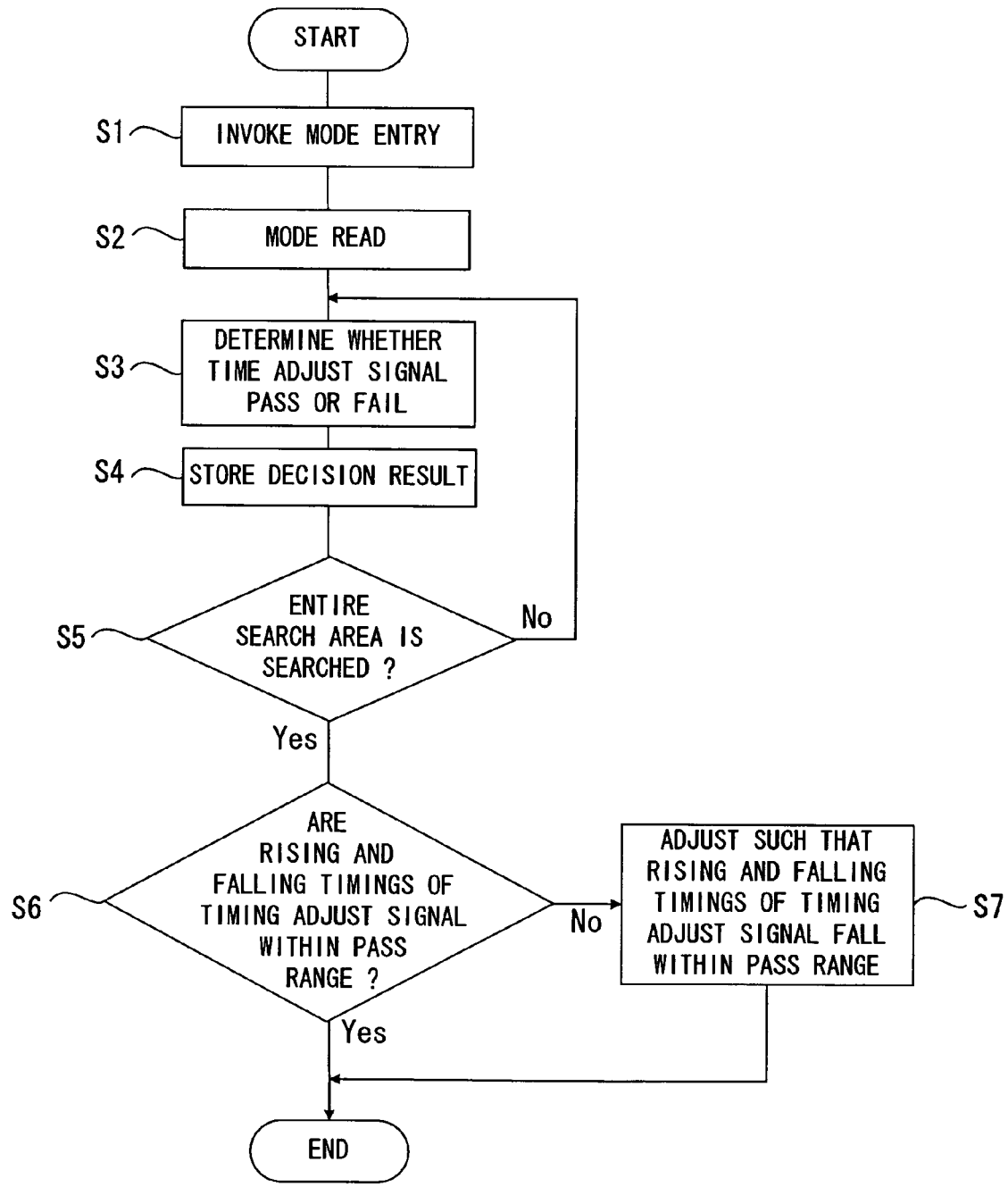
FIG. 6 is a flowchart showing a setting method of a timing adjust signal in accordance with one embodiment of the present invention.
Figure 7:
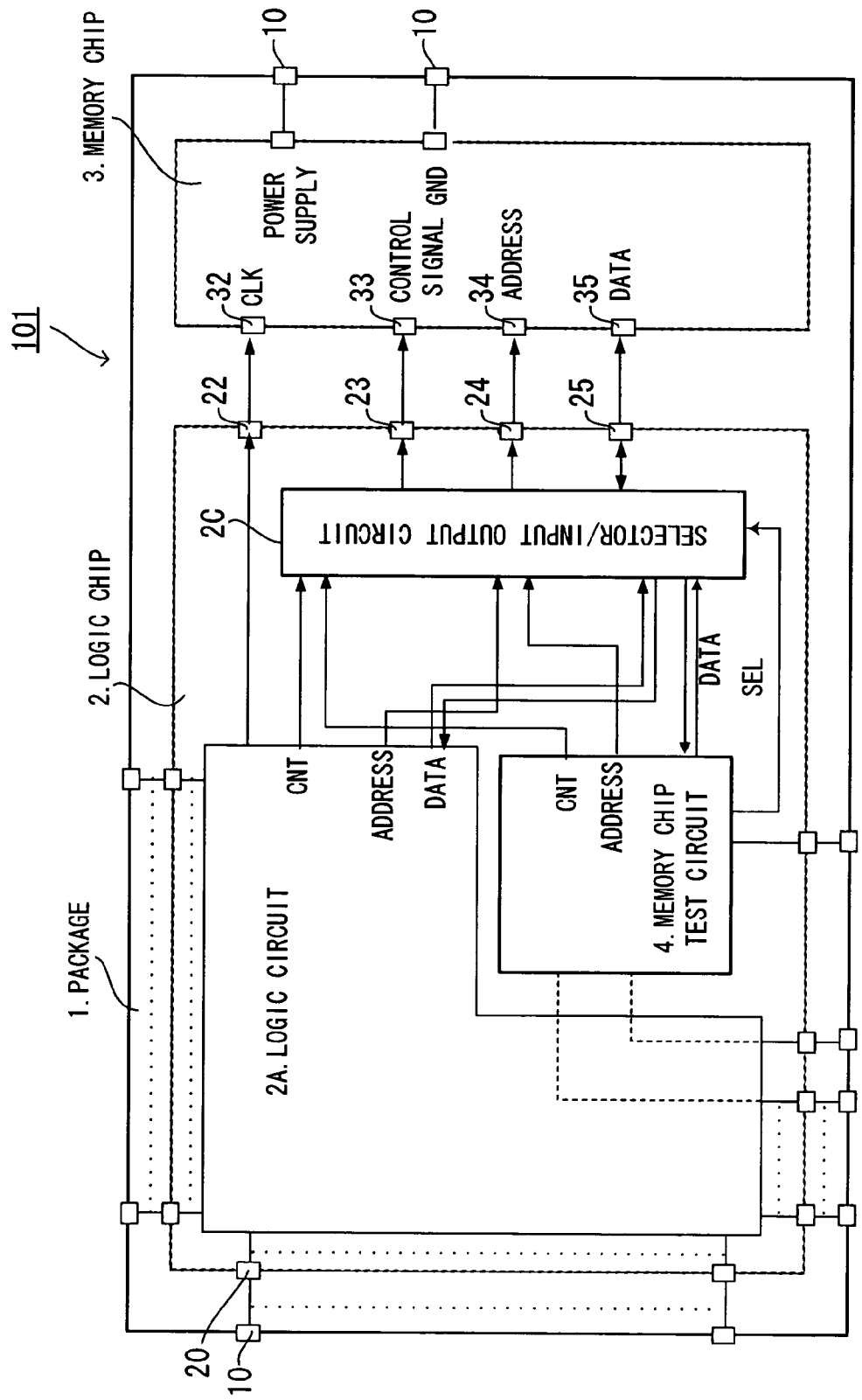
FIG. 7 is a block diagram of a semiconductor integrated circuit device in accordance with related art 1.
Figure 8:
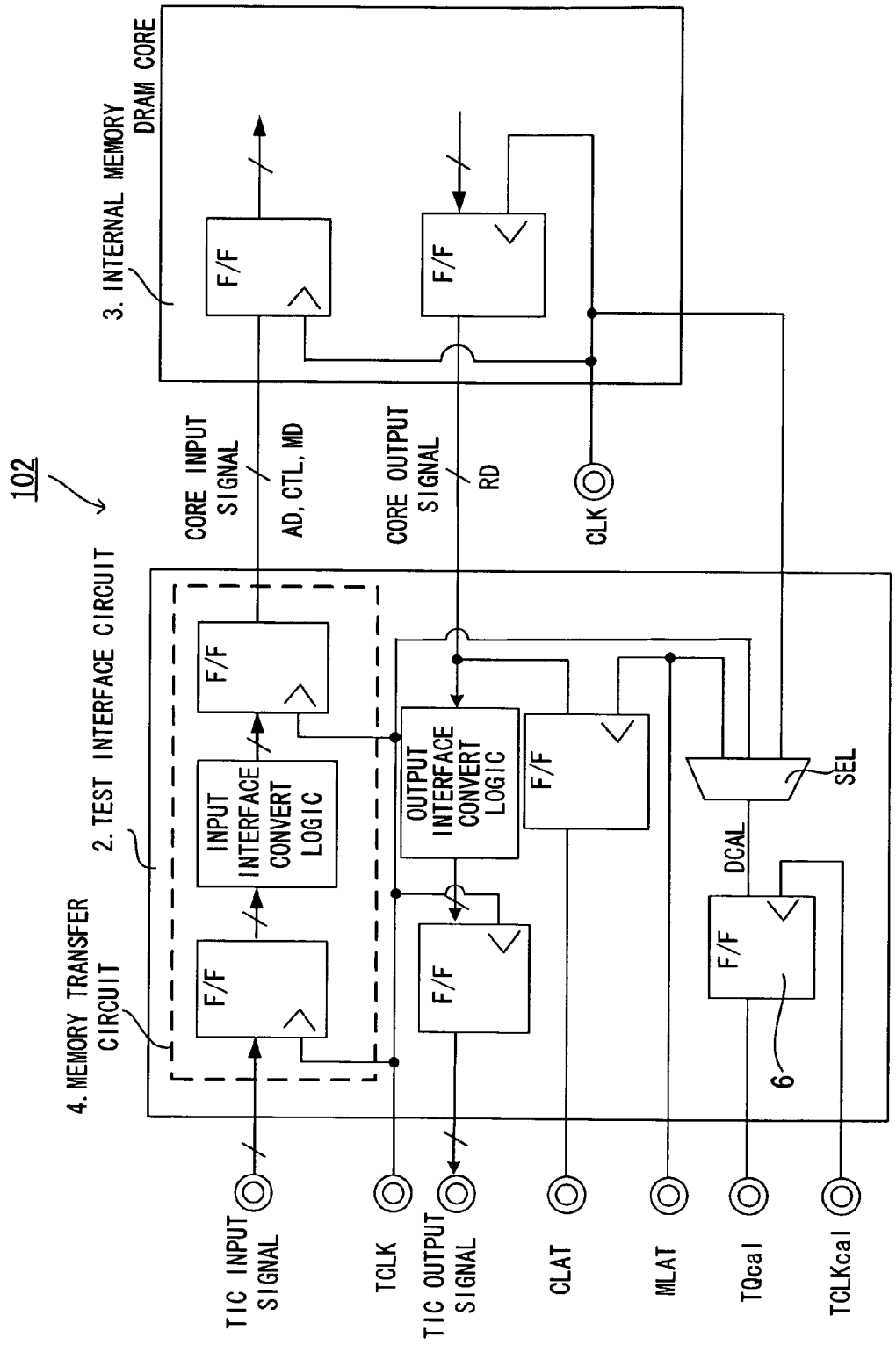
FIG. 8 is a block diagram of a semiconductor integrated circuit device in accordance with related art 2.

FIG. 6 is a flowchart for illustrating an adjusting method of a timing adjust signal by the tester 4. Firstly, a mode entry in the tester 4 is invoked (S1). Then, a mode is read out (S2). At this point, when the output hold time of a test signal is within the specified value range and the taken-in retain time of the test signal is also within the specified value range, it is referred as "Pass", and at least one of the output hold time and taken-in retain time of the test signal is outside of the corresponding specified value range, it is referred as "Fail". After the step S2, it is determined to be Pass or Fail (S3).

In FIG. 3A, a symbol "P" represents a Pass timing that satisfies the specified values for a set-up time and a hold time, and a symbol "F" represents a Fail timing that does not satisfy at least one of these specified values. The decision result is written into the storage portion (not shown) of the tester 4 (S4). The above-mentioned steps S1-S4 are repeated until the entire search area is searched (S5). In this manner, the area of the Pass window is stored in the storage portion of the tester 4.

After the search is completed, it is determined whether or not the rising and falling timings of the actual timing adjust signal are within the Pass window based on the Pass window information stored in the storage portion of the tester 4 (S6). When it is within the Pass window, the method is completed without any adjustment to the timing adjust signal. When it is not within the Pass window, the tester 4 makes an adjustment by inputting timing signals to generate a timing adjust signal such that the rising and falling timings of the timing adjust signal are within the Pass window (S7), and then the setting of the timing adjust signal is completed. In this manner, the timing adjust signal has the timing that enables the control command signal to satisfy the specified values for a set-up time and a hold time (see the areas "a" and "b" in FIG. 3B).

Figure 4A:
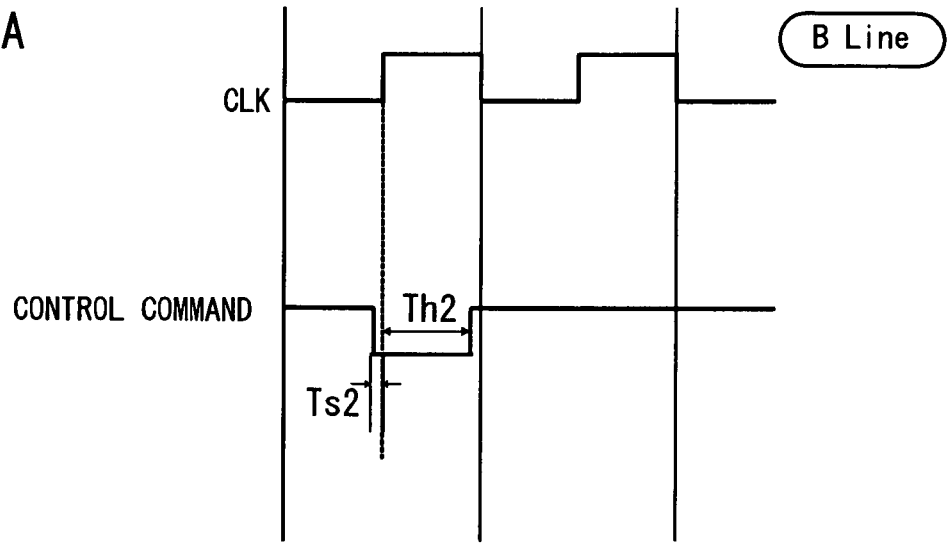
FIGS. 4A and 4B are timing charts at the dotted line B in FIG. 1.
Figure 4B:
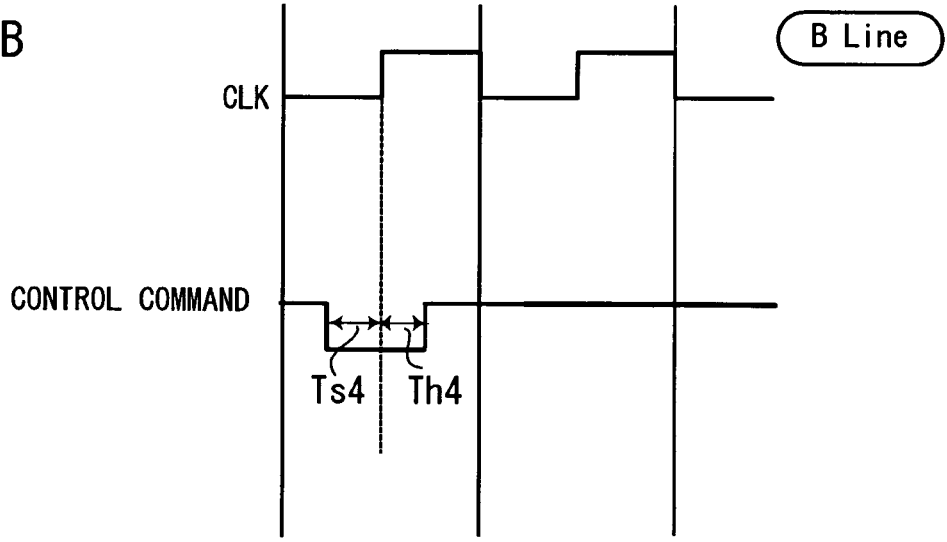

FIGS. 4A and 4B show timing charts at the flip-flop circuit 73 (the dotted line B in FIG. 1). FIG. 4A is an example of a timing chart before the above-mentioned timing adjustment. Similarly to FIG. 3A, in the example, the command signal does not satisfy the specified value for a set-up time, while it satisfies the specified value for a hold time with an ample margin.

After the tester 4 establishes the timing adjust signal in accordance with the flow shown in FIG. 6 (see the areas "a" and "b" in FIG. 3B), the timing of the control command signal is corrected in accordance with that signal timing. That is, the timing correction circuit 63 re-establishes the timing so as to maintain the specified values for the set-up time and hold time of the control command signal. Specifically, it re-establishes the timing such that the falling timing of the timing adjust signal coincides with the falling timing of the control command signal, and the rising timing of the timing adjust signal coincides with the rising timing of the control command signal. As a result, as shown in FIG. 4B, the output hold time Ts4 of the control command signal at the flip-flop circuit 73 falls within the range that satisfies the specified value for the set-up time, and the taken-in retain time Th4 falls within the range that satisfies the specified value for the hold time.

Figure 5:
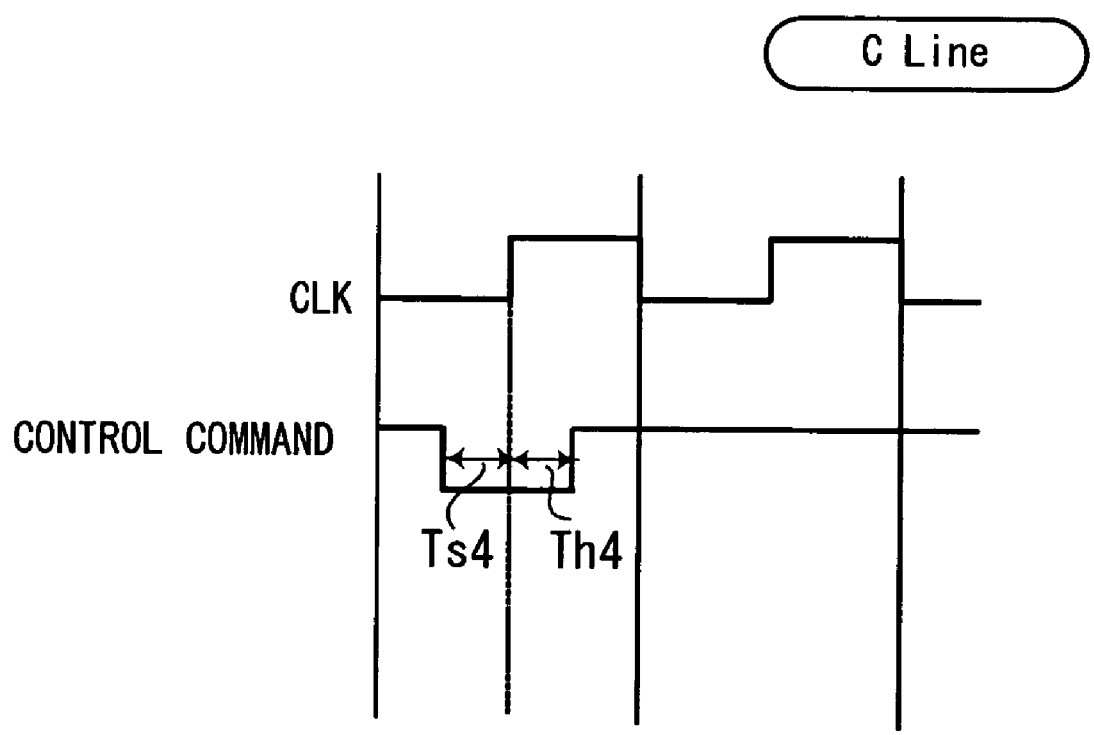
FIG. 5 is a timing chart at the dotted line C in FIG. 1.

FIG. 5 shows a timing chart at the point shown by the dotted line C in FIG. 1 (i.e., at the point where signals are inputted to the memory chip 3). The control command signal that is adjusted in accordance with the above-mentioned flow is sent out to the memory chip 3 while maintaining the timing with respect to the clock signal. As a result, as shown in FIG. 5, the control command signal that satisfies the specified values for a set-up time and a hold time is inputted to the memory chip. In this manner, the unimpaired high-speed memory chip operation can be achieved. Furthermore, the installation of the timing adjust pin 14 enables more accurate measurement of a set-up time and a hold time of the memory. Furthermore, it also enables more precise measurement of a set-up time and a hold time possessed by the semiconductor integrated circuit device.

Incidentally, while the case where the control command signal does not satisfy the specific value for a set-up time is explained in above-mentioned example, the address signal, data signal, and other test signals can also corrected in a similar manner. Furthermore, the correction can be also carried out in a case where the signal does not satisfy the specified value for a hold time. Furthermore, while the case where the signal is inputted to the memory chip 3 is explained in above-mentioned example, the timing correction can be also carried out in a case where the signal is inputted from the memory chip 3 to the logic chip 2, i.e., a case where the signal is outputted from the memory.

In accordance with this example of the present invention, the timing between a clock signal and a test signal in SiP structure in which a logic chip and a memory chip are mounted in a single package is controlled by using the timing adjust signal sent out from an external device. Therefore, the timing of the clock signal and test signal can be adjusted without increasing the number of external terminals. That is, the unimpaired high-speed memory chip operation independent of the delay amount caused in the path between the first chip and second chip can be achieved. Furthermore, the control timing to the memory chip can be externally controlled without having a memory chip test circuit for the memory chip test in the logic chip. Therefore, the development period can be reduced by increasing the efficiency of the test, while allowing the restriction on the increase in a chip area. Furthermore, the through circuit is a circuit that is not used in the normal operation of the semiconductor integrated circuit device. In a semiconductor integrated circuit device in accordance with one embodiment of the present invention, even if a faulty delay time is caused by the through circuit, that faulty delay time is corrected by the timing adjust signal inputted from an external device. That is, the present embodiment can prevent a semiconductor integrated circuit device from being handled as a defective product just because of a failure in the circuit that is not used in the normal operation, and thereby it can increase the yield rate.

Although an example of a semiconductor integrated circuit device having SiP structure in which a memory chip and a logic chip are mounted in a single package are explained in the above-mentioned embodiment, the present invention can also applied to other semiconductor integrated circuit devices in general in which several plural chips having different functions are mounted on a single package and the operation test for the second chip is carried out through the first chip.

It is apparent that the present invention is not limited to the above embodiments, but may be modified and changed without departing from the scope and spirit of the invention.

What is claimed is:

1. A semiconductor integrated circuit device comprising:
    a first chip;
    a second chip to transmit and receive data to and from the first chip; and
    a through circuit provided in the first chip to transfer a clock signal and a test signal to the second chip, the clock signal and the test signal being inputted from an external device;
    wherein the through circuit adjusts timing relation between the clock signal and the test signal based on a timing adjust signal, the timing adjust signal being inputted from the external device.

2. The semiconductor integrated circuit device according to claim 1, wherein the through circuit adjusts the output timing of the test signal such that the test signal satisfies specified values for a set-up time and a hold time with respect to the rising edge or the falling edge of the clock signal.

3. The semiconductor integrated circuit device according to claim 2, wherein the through circuit comprises:
    a flip-flop circuit to retain the test signal based on the clock signal; and
    a timing adjust circuit to adjust timing relation of the clock signal and the test signal based on the timing adjust signal, and output the adjusted test signal to the flip-flop circuit; and
    wherein the timing adjust signal is controlled by the external device; and the timing correction circuit searches for a pass range for the timing adjust signal to satisfy the specified values for the set-up time and the hold time with respect to the clock signal, and sets the output timing of the test signal based on the pass range.

4. The semiconductor integrated circuit device according to claim 2, wherein the through circuit becomes the operation state in the operation verification test for the second chip, and becomes the non-operation state in states other than the operation verification test for the second chip.

5. The semiconductor integrated circuit device according to claim 2, wherein the first chip is a logic chip, and the second chip is a memory chip.

6. The semiconductor integrated circuit device according to claim 1, wherein the through circuit comprises:
   a flip-flop circuit to retain the test signal based on the clock signal; and
   a timing adjust circuit to adjust timing relation of the clock signal and the test signal based on the timing adjust signal, and output the adjusted test signal to the flip-flop circuit; and
   wherein the timing adjust signal is controlled by the external device; and the timing correction circuit searches for a pass range for the timing adjust signal to satisfy the specified values for the set-up time and the hold time with respect to the clock signal, and sets the output timing of the test signal based on the pass range.

7. The semiconductor integrated circuit device according to claim 6, wherein the timing correction circuit corrects the delay time of the test signal by using a time value at or near the center of the pass range.

8. The semiconductor integrated circuit device according to claim 7, wherein the through circuit becomes the operation state in the operation verification test for the second chip, and becomes the non-operation state in states other than the operation verification test for the second chip.

9. The semiconductor integrated circuit device according to claim 7, wherein the first chip is a logic chip, and the second chip is a memory chip.

10. The semiconductor integrated circuit device according to claim 6, wherein the through circuit becomes the operation state in the operation verification test for the second chip, and becomes the non-operation state in states other than the operation verification test for the second chip.

11. The semiconductor integrated circuit device according to claim 6, wherein the first chip is a logic chip, and the second chip is a memory chip.

12. The semiconductor integrated circuit device according to claim 1, wherein the through circuit becomes the operation state in the operation verification test for the second chip, and becomes the non-operation state in states other than the operation verification test for the second chip.

13. The semiconductor integrated circuit device according to claim 12, wherein the first chip is a logic chip, and the second chip is a memory chip.

14. The semiconductor integrated circuit device according to claim 1, wherein the first chip is a logic chip, and the second chip is a memory chip.

\* \* \* \* \*